United States Patent [19]

Hsi-Jung et al.

[11] Patent Number: 5,432,465
[45] Date of Patent: Jul. 11, 1995

[54] INTEGRATED CIRCUIT SWITCHABLE BETWEEN A LINE DRIVER FUNCTION AND A BIDIRECTIONAL TRANSCEIVER FUNCTION DURING THE PACKAGING STAGE OF THE INTEGRATED CIRCUIT

[75] Inventors: Tsai Hsi-Jung; Tsai Chao-Ming, both of Hsinchu, Taiwan

[73] Assignee: Windbond Electronics Corp., Hsinchu, Taiwan

[21] Appl. No.: 239,222

[22] Filed: May 6, 1994

[51] Int. Cl.$^6$ ............................................. H03K 19/00
[52] U.S. Cl. ......................................... 326/38; 326/86
[58] Field of Search ...................... 326/38, 62, 82, 86; 327/403; 365/63

[56] References Cited

U.S. PATENT DOCUMENTS

| | | | |
|---|---|---|---|
| 4,835,418 | 5/1989 | Hsieh | 307/473 |
| 4,987,319 | 1/1991 | Kawana | 307/465 |
| 5,051,622 | 9/1991 | Pleva | 307/465 |
| 5,111,079 | 5/1992 | Steele | 307/465 |
| 5,115,149 | 5/1992 | Hashimoto | 307/475 |
| 5,233,241 | 8/1993 | Nishimori | 307/465 |
| 5,248,908 | 9/1993 | Kimura | 307/465 |
| 5,303,180 | 4/1994 | McAdams | 365/63 |

*Primary Examiner*—David R. Hudspeth
*Attorney, Agent, or Firm*—Christensen O'Connor Johnson & Kindness

[57] ABSTRACT

An integrated circuit which is switchable between a line driver function and a bidirectional transceiver function is provided. The integrated circuit comprises a first buffer, a second buffer and a logic control function. The first buffer has a first input terminal, a first output terminal, and a first control terminal which receives a first control signal. The second buffer has a second input terminal coupled to the first output terminal, has a second output terminal coupled to the first input terminal and has a second control terminal which receives a second control signal. The logic control function generates the first and second control signals responsive to a selection signal, a direction signal and an output enable signal. As the selection signal is asserted the invention functions as a line driver, and as the selection signal is negated the invention functions as a bidirectional transceiver.

6 Claims, 5 Drawing Sheets

INTEGRATED CIRCUIT SWITCHABLE BETWEEN A LINE DRIVER FUNCTION AND A BIDIRECTIONAL TRANSCEIVER FUNCTION DURING THE PACKAGING STAGE OF THE INTEGRATED CIRCUIT

TECHNICAL FIELD OF THE INVENTION

This invention relates to an integrated circuit and, in particular, relates to an integrated circuit switchable between a line driver and a bidirectional transceiver.

BACKGROUND OF THE INVENTION

The line driver integrated circuit (IC) and bidirectional transceiver IC have been widely used in the field of electronic equipments. The line driver acts as a buffer and provides driving power in the electronic circuit. The bidirectional transceiver play the same role as the line driver. The major difference between them is the direction of the data transmission. While the line driver provides only one direction data transmission, the bidirectional transceiver provides bidirectional data transmission.

In FIG. 1, a typical line driver circuit having 8 input lines and 8 output lines is shown. In FIG. 2, a typical bidirectional transceiver having 8 bidirectional data lines is shown.

It is known both circuits have common mask layout with the exception of some proprietary mask layouts for the bidirectional transceiver. Therefore some IC manufactures by adopting IC manufacturing processes known as metal option or buried-N option produce selectively the line driver and the bidirectional transceiver with same set of mask layouts. In other words, the line driver is produced by the same set of mask layouts as those used in producing the bidirectional transceiver except the metal or buried-N mask. This kind of approach obviously reduces the cost of manufacturing the line driver or bidirectional transceiver compared to the conventional approach, not to mention other merits.

The instant invention provides a different approach to selectively produce the line driver or the bidirectional transceiver with same set of mask by a bonding option approach.

By selectively bonding or not bonding a pad corresponding to a selection signal of an integrated circuit of the instant invention, the line driver function or bidirectional transceiver function may be selectively determined by the invention.

SUMMARY OF THE INVENTION

The invention provides an integrated circuit which is switchable between a line driver function and a bidirectional transceiver function. The integrated circuit comprises a first buffer, a second buffer and a logic control function.

The first buffer has a first input terminal, a first output terminal and a first control terminal which receives a first control signal.

The second buffer has a second input terminal coupled to the first output terminal, has a second output terminal coupled to the first input terminal and has a second control terminal which receives a second control signal.

The logic control function generates the first and second control signals responsive to a selection signal, a direction signal and an output enable signal.

As the selection signal is asserted the integrated circuit functions as a line driver, and as the selection signal is negated the integrated circuit functions as a bidirectional transceiver.

DETAILED DESCRIPTION OF THE PREFERRED EMBODIMENT

Figure 1:
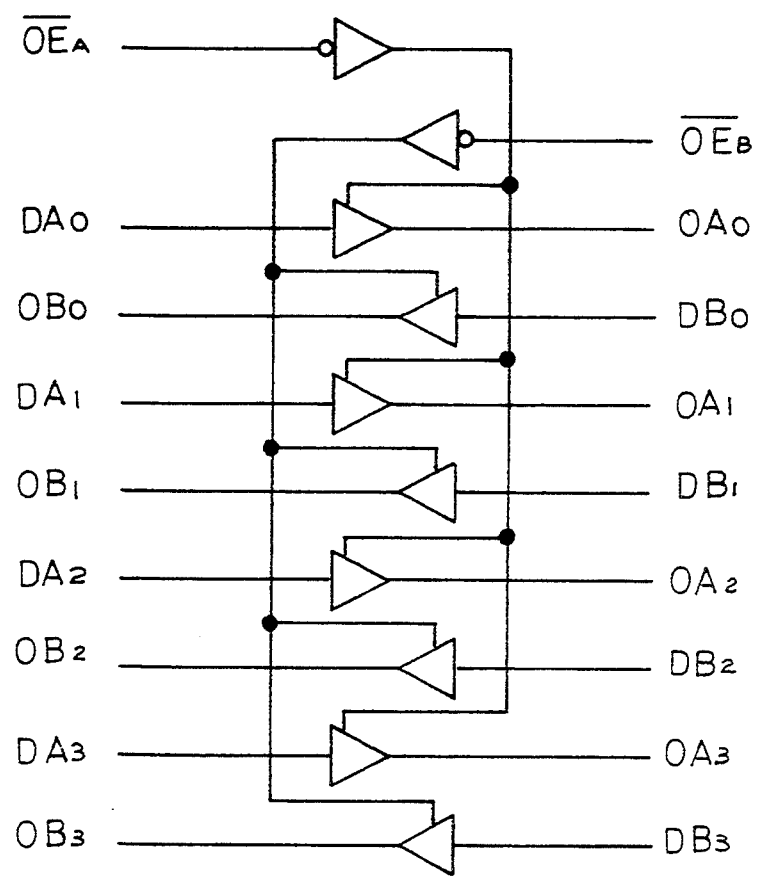
FIG. 1 shows a typical line driver circuit.
Figure 2:
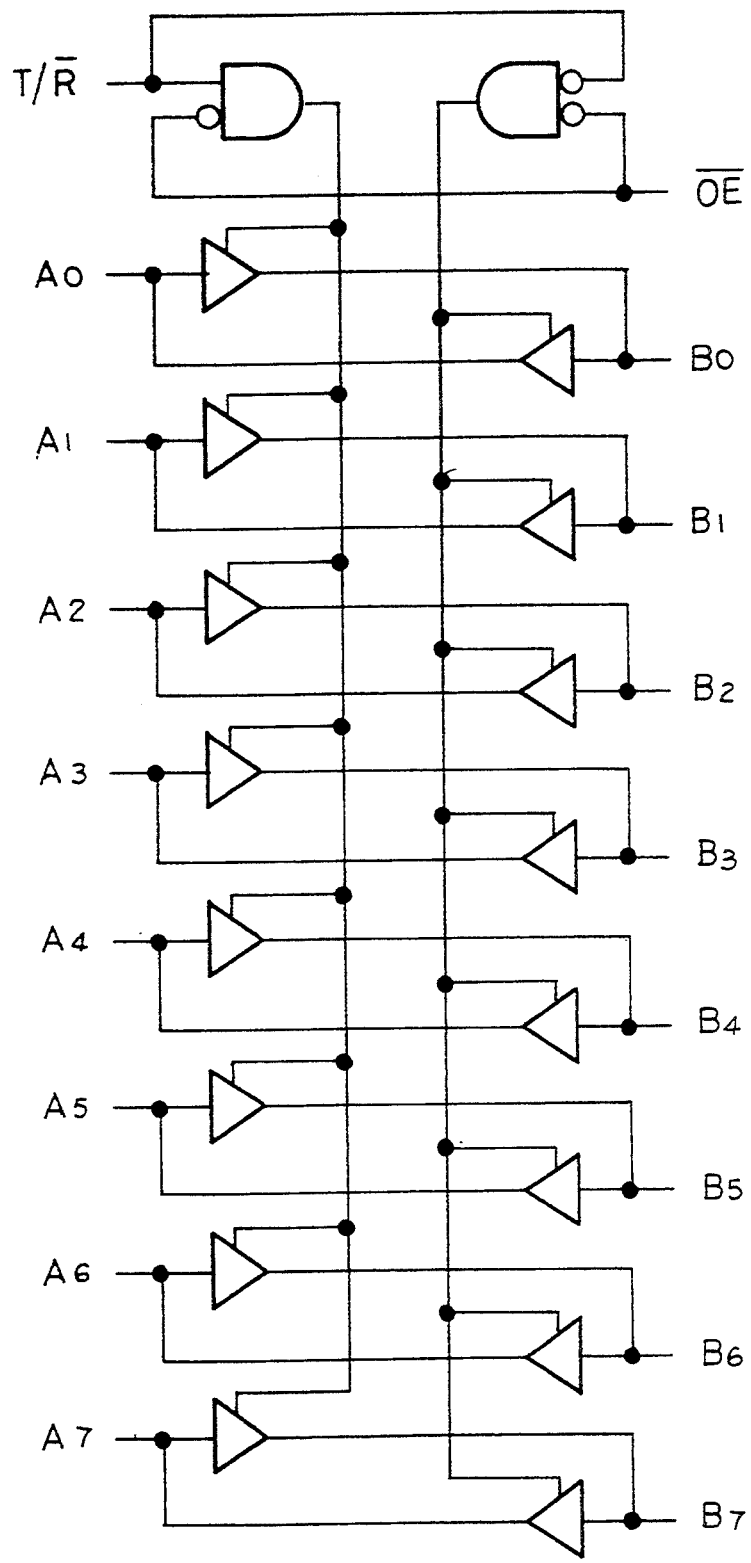
FIG. 2 shows a typical bidirectional transceiver circuit.
Figure 3:
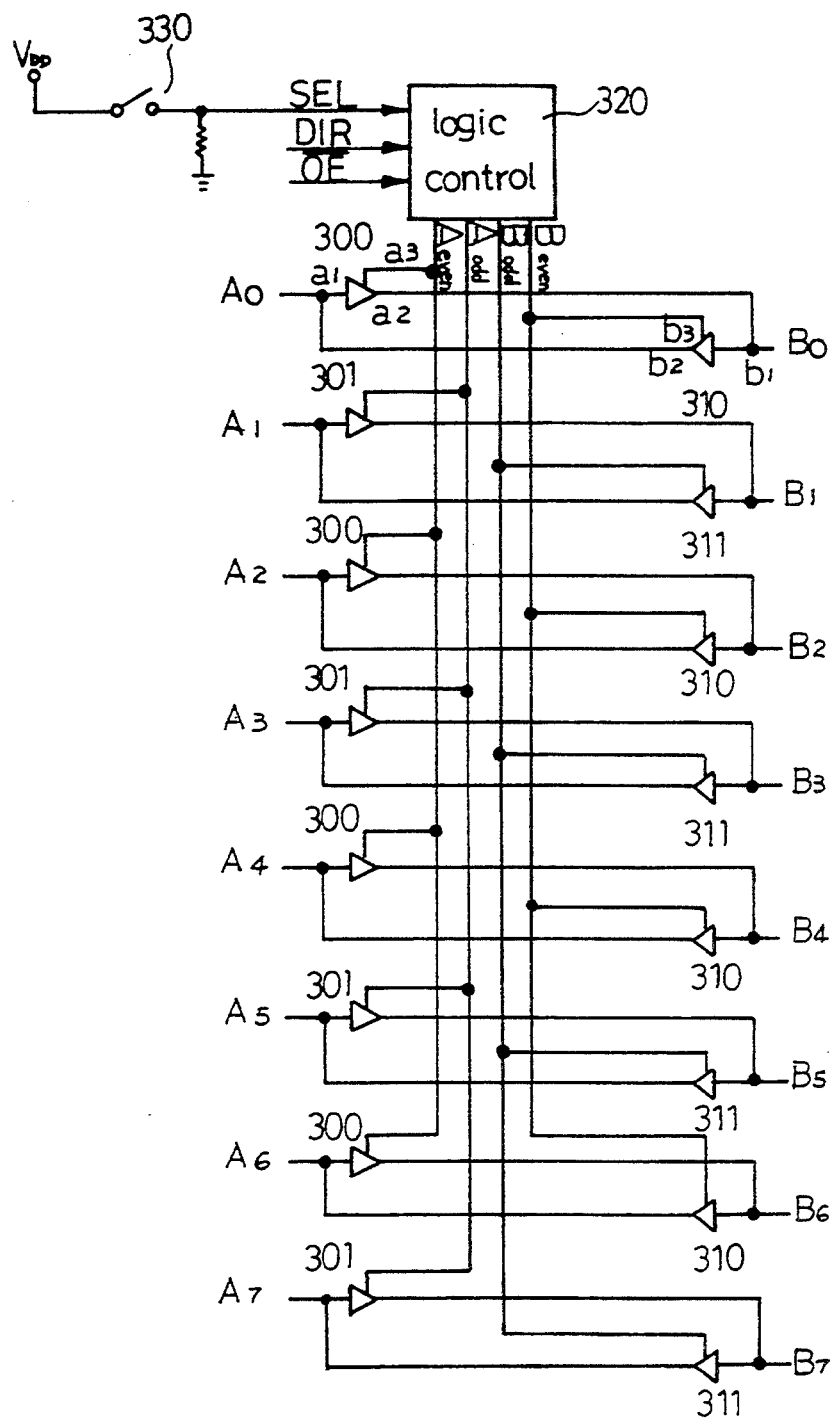
FIG. 3 shows an integrated circuit in accordance with the invention.

As shown in FIG. 3, the invention provides an integrated circuit 3 which is switchable between a line driver function and a bidirectional transceiver function.

The integrated circuit 3 comprises a plurality of first buffers, a plurality of second buffers and a logic control function 320. The plurality of first buffers are divided into a first set 300 and a second set 301 as shown in FIG. 3. The plurality of second buffers are divided into a first set 310 and a second set 311 as shown in FIG. 3.

Each of the plurality of first buffers 300 has a first input terminal $a_1$, a first output terminal $a_2$ and a first control terminal $a_3$ which receives a first control signal $A_{even}$.

Each of the plurality of first buffers 301 has a first input terminal $a_1$, a first output terminal $a_2$ and a first control terminal $a_3$ which receives a third control signal $A_{odd}$.

Each of the plurality of second buffers 310 has a second input terminal $b_1$ coupled to the first output terminal $a_2$, has a second output terminal $b_2$ coupled to the first input terminal $a_1$ and has a second control terminal $b_3$ which receives a second control signal $B_{even}$.

Each of the plurality of second buffers 311 has a second input terminal $b_1$ coupled to the first output terminal $a_2$, has a second output terminal $b_2$ coupled to the first input terminal $a_1$ and has a second control terminal $b_3$ which receives a fourth control signal $B_{odd}$.

The logic control function 320 generates the first control signal $A_{even}$ and the second control signal $B_{even}$ responsive to a selection signal SEL, a direction signal DIR and an output enable signal $\overline{OE}$.

The logic control function 320 also generates the third control signal $A_{odd}$ and the fourth control signal $B_{odd}$ responsive to the selection signal SEL, the direction signal DIR and the output enable signal $\overline{OE}$.

The state equations of the logic control function 320 are:

$$A_{even} = \overline{SEL} * \overline{OE} * (DIR) + SEL * (\overline{DIR})$$

$$A_{odd} = \overline{SEL} * \overline{OE} * (DIR)$$

$$B_{even} = \overline{SEL} * \overline{OE} * (\overline{DIR})$$

$$B_{odd} = \overline{SEL} * \overline{OE} * (\overline{DIR}) + SEL * \overline{OE}$$

As the selection signal SEL is asserted the integrated circuit 3 functions as a line driver, and as the selection signal SEL is negated the integrated circuit 3 functions as a bidirectional transceiver.

Figure 4:
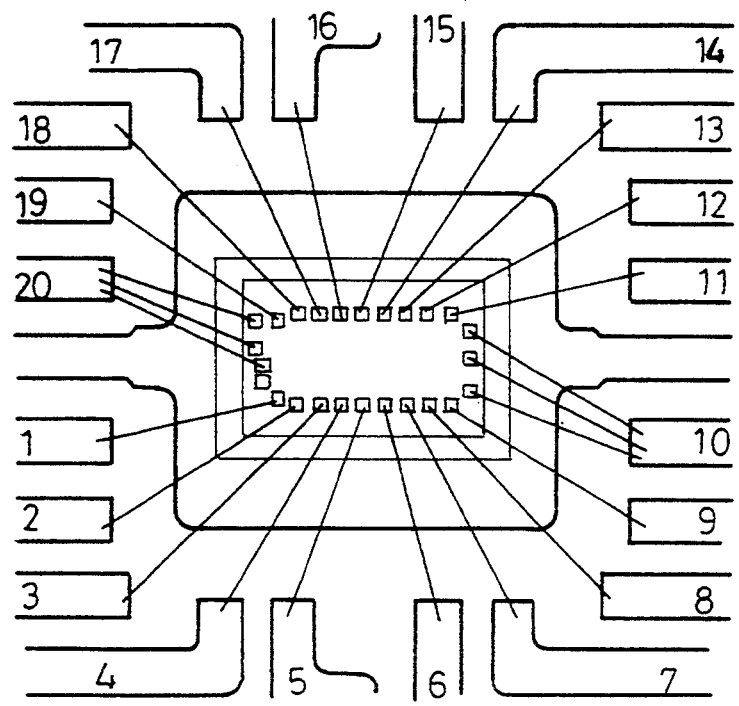
FIG. 4 shows a bonding diagram illustrating a line driver function is selected at packaging stage of the invention.
Figure 5:
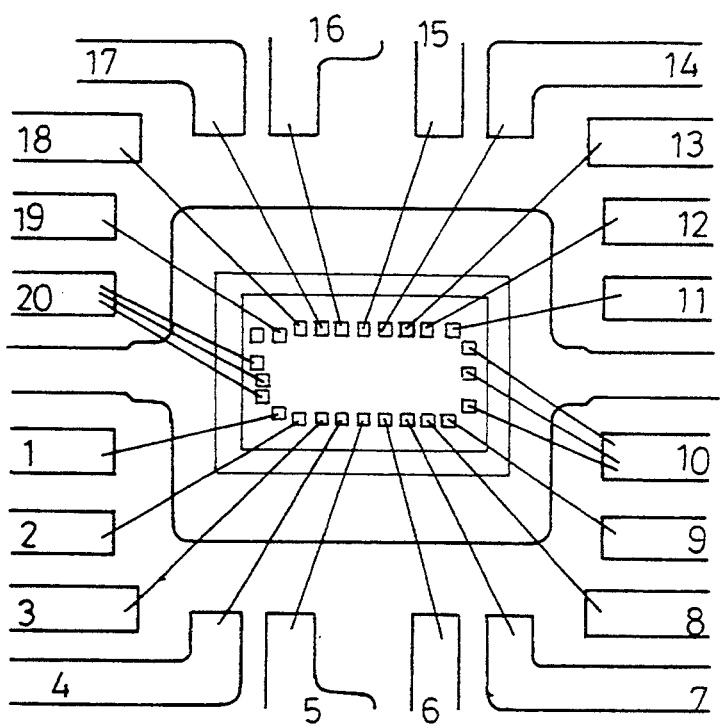
FIG. 5 shows a bonding diagram illustrating a bidirectional transceiver function is selected at packaging stage of the invention.
Figure 6:
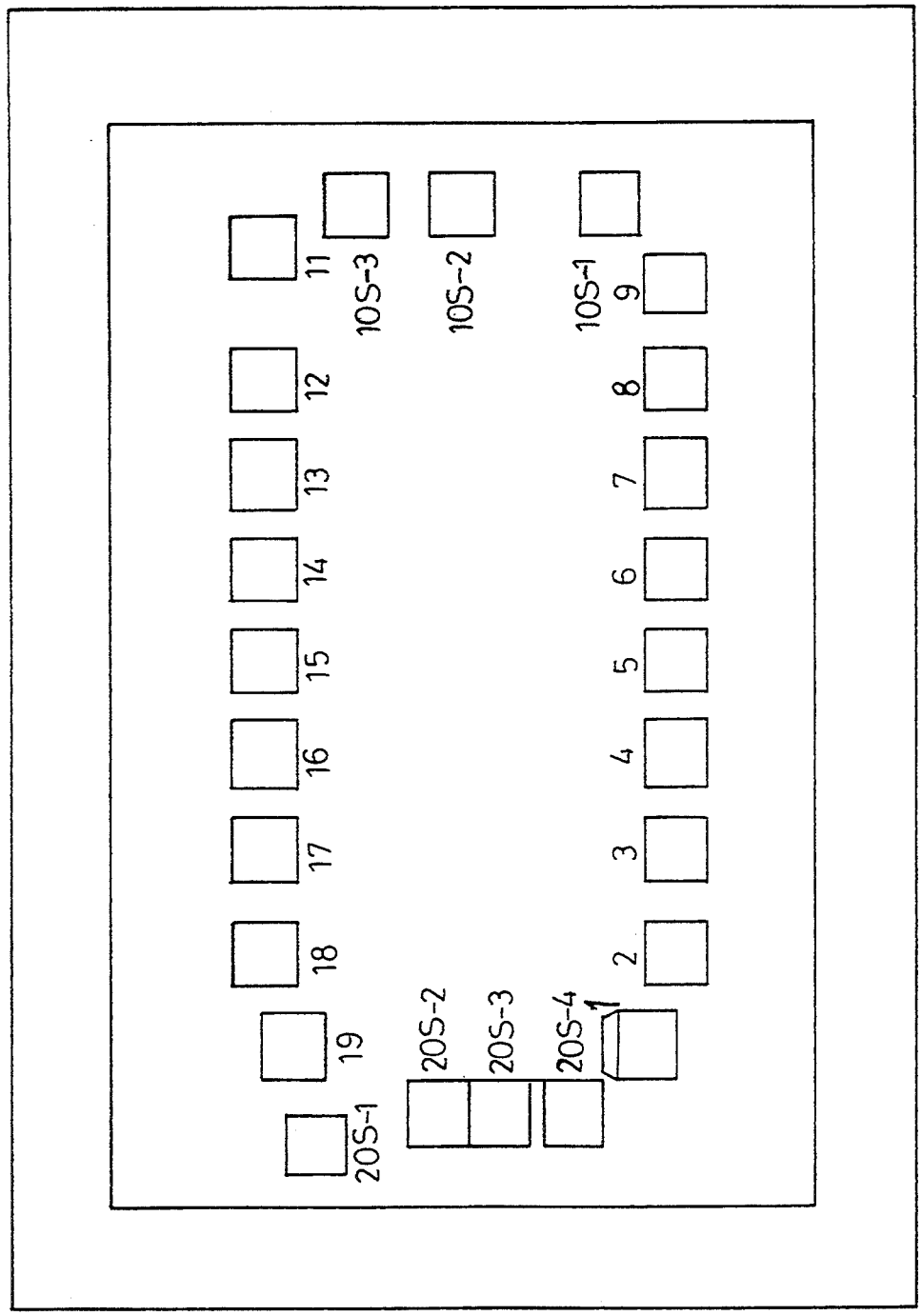
FIG. 6 is an enlarged diagram of the pad list of FIG. 4 and FIG. 5.

The state of the selection signal SEL is controlled by the option state of the bonding lead 330 between the Vdd and a pad corresponding to the selection signal SEL as shown in FIG. 3 and FIG. 4. As the bonding pad 20S-1 of the integrated circuit corresponding to the selection signal SEL is bonded to Vdd via an external pin 20 as shown in FIG. 4, the SEL signal is asserted and the integrated circuit 3 turns out to be a line driver. To the contrary, as the pad 20S-1 corresponding to the selection signal SEL is not bonding to any external pins as shown in FIG. 5, the SEL signal is negated and the integrated circuit 3 turns out to be a bidirectional transceiver.

In FIG. 4, three pads 20S-1, 20S-2 and 20S-3 are connected to the pin 20 via its corresponding lead. In FIG. 5, three pads 20S-2, 20S-3 and 20S-4 are connected to the pin 20 via its corresponding lead. The pad 20S-1 corresponds to the SEL signal, the pads 20S-2, 20S-3 and 20S-4 correspond to Vdd.

The selection to make a line driver or a bidirectional transceiver by the integrated circuit 3 of the invention is done at the final lead bonding stage of the IC packaging process in accordance with the instant invention.

Table 1 shows an input/output relationship of the invention.

TABLE 1

| INPUTS | | | |
|---|---|---|---|
| SEL | DIR | $\overline{OE}$ | OUTPUTS |
| NOT-BONDING | L | L | BUS B DATA TO BUS A |
| NOT-BONDING | L | H | BUS A DATA TO BUS B |
| NOT-BONDING | H | X | HIGH Z STATE |
| BONDING TO VDD | L | L | DATA FROM AI TO BI, I=0,2,4,6 |
| BONDING TO VDD | L | L | DATA FROM BJ TO AJ, J=1,3,5,7 |
| BONDING TO VDD | H | H | HIGH Z STATE |

The detailed arrangements of the preferred embodiments of the invention aforesaid are illustrative rather than limiting. Any equivalent modifications, substitutes, alterations or changes to the preferred embodiment without departing from the spirit of the invention are likely to the persons ordinary skilled in the art, and are still within the intended scope of the protection of the invention which is defined by the following claims.

What is claimed is:

1. An integrated circuit switchable between a line driver function and a bidirectional transceiver function, comprising:

a first buffer means, having a first input terminal, a first output terminal and a first control terminal receiving a first control signal;

a second buffer means, having a second input terminal coupled to the first output terminal, a second output terminal coupled to the first input terminal and a second control terminal receiving a second control signal;

a logic control means for generating the first and second control signals responsive to a selection signal, a direction signal and an output enable signal;

wherein as the selection signal is asserted the circuit functions as a line driver, and as the selection signal is negated the circuit functions as a bidirectional transceiver.

2. The integrated circuit as recited in claim 1, wherein the selection signal being received at a pad of the integrated circuit.

3. The integrated circuit as recited in claim 2, wherein the selection signal is asserted by selectively bonding the pad to a reference voltage during the integrated circuit packaging stage.

4. The integrated circuit as recited in claim 2, wherein the selection signal is asserted by selectively not bonding the pad to a reference voltage during the integrated circuit packaging stage.

5. The integrated circuit as recited in claim 2, wherein the selection signal is negated by selectively bonding the pad to a reference voltage during the integrated circuit packaging stage.

6. The integrated circuit as recited in claim 2, wherein the selection signal is negated by selectively not bonding the pad to a reference voltage during the integrated circuit packaging stage.

* * * * *